United States Patent
Miura

(10) Patent No.: US 8,981,474 B2
(45) Date of Patent: Mar. 17, 2015

(54) SEMICONDUCTOR DEVICE

(75) Inventor: Noriyuki Miura, Miyagi (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 259 days.

(21) Appl. No.: 13/614,529

(22) Filed: Sep. 13, 2012

(65) Prior Publication Data

US 2013/0069156 A1 Mar. 21, 2013

(30) Foreign Application Priority Data

Sep. 21, 2011 (JP) ................. 2011-206216

(51) Int. Cl.
*H01L 29/66* (2006.01)
*H01L 29/786* (2006.01)
*H01L 29/06* (2006.01)

(52) U.S. Cl.
CPC .... H01L 29/78615 (2013.01); H01L 29/78624 (2013.01); *H01L 29/0692* (2013.01)
USPC .................. 257/335; 257/E29.261

(58) Field of Classification Search
CPC .................. H01L 29/78615; H01L 29/78624; H01L 29/0692
USPC .......................... 257/335, E29.261
See application file for complete search history.

(56) References Cited

U.S. PATENT DOCUMENTS

| | | | |
|---|---|---|---|
| 2009/0315110 A1* | 12/2009 | Vashchenko | 257/344 |
| 2010/0270615 A1* | 10/2010 | Lin et al. | 257/343 |
| 2012/0061758 A1* | 3/2012 | Khan et al. | 257/343 |
| 2012/0273878 A1* | 11/2012 | Mallikarjunaswamy | 257/335 |
| 2012/0286322 A1* | 11/2012 | Wang et al. | 257/133 |
| 2012/0299096 A1* | 11/2012 | Huo et al. | 257/343 |
| 2013/0009272 A1* | 1/2013 | Sakurai et al. | 257/496 |
| 2013/0134511 A1* | 5/2013 | Yang et al. | 257/339 |
| 2013/0168767 A1* | 7/2013 | Lin et al. | 257/337 |
| 2013/0295728 A1* | 11/2013 | Lin et al. | 438/135 |
| 2013/0344672 A1* | 12/2013 | Yang et al. | 438/294 |
| 2014/0001548 A1* | 1/2014 | Chen et al. | 257/337 |
| 2014/0027849 A1* | 1/2014 | Yang et al. | 257/343 |
| 2014/0061731 A1* | 3/2014 | Chen et al. | 257/272 |
| 2014/0232513 A1* | 8/2014 | Chan et al. | 338/215 |
| 2014/0299945 A1* | 10/2014 | Huang et al. | 257/408 |

FOREIGN PATENT DOCUMENTS

| JP | 2000-269509 A | 9/2000 |
|---|---|---|
| JP | 2005-276912 A | 10/2005 |

* cited by examiner

*Primary Examiner* — Vongsavanh Sengdara
(74) *Attorney, Agent, or Firm* — Rabin & Berdo, P.C.

(57) ABSTRACT

A semiconductor device formed on a silicon-on-insulator substrate includes a gate electrode, a gate insulation film, a drain diffusion region, a drift region, a body region, a plurality of source diffusion regions, and a plurality of charge collection diffusion regions. The source diffusion regions and charge collection diffusion regions are of mutually opposite conductivity types, and alternate with one another in the direction paralleling the width of the gate electrode. The half-width of each source diffusion region is equal to or less than the length of the gate electrode plus the half-length of the drift region.

11 Claims, 11 Drawing Sheets

SEMICONDUCTOR DEVICE

BACKGROUND OF THE INVENTION

1. Field of the Invention

The present invention relates to a semiconductor device, more particularly a semiconductor-on-insulator device including a field-effect transistor, and to its fabrication method.

2. Description of the Related Art

Energy conservation and power efficiency are demanded in modern electrical and electronic devices, including consumer devices, automotive devices, and lighting devices. Light emitting diode (LED) illumination, photovoltaic power generation, and power management, in which power is supplied to only the necessary operational blocks in an electrical or electronic device, are among the technologies being developed to meet these demands. There are also demands for greater power efficiency and smaller size in the field of power electronics, particularly regarding the metal-oxide-semiconductor field-effect transistors (MOSFETs) that consume large amounts of power in power electronics circuits. A recent trend is the development of integrated circuits that include a power device, its control circuit or driving circuit, and other peripheral circuitry on a single chip. Compared with bulk silicon substrates, semiconductor-on-insulator (SOI) substrates are advantageous because they can provide almost complete electrical isolation between circuit elements with different functions. This makes the SOI device structure particularly suited for single chips including both power devices, to which high voltages are applied, and their peripheral circuits.

A field-effect transistor (FET) with an SOI device structure is known to be particularly vulnerable to floating body effects, also referred to as floating kink effects or floating substrate effects. In an SOI substrate, the semiconductor layer overlies a buried insulating layer, which separates the semiconductor layer from the underlying substrate layer or base layer. An FET fabricated on an SOI substrate has a body region surrounded by a source region, a drain diffusion region, and the buried insulating layer. When a conductive channel is formed in the body region between the source and drain diffusion regions and impact ionization occurs around the edge of the body region next to the drain diffusion region, electron-hole pairs are generated. Majority carriers (holes in an n-channel FET, electrons in a p-channel FET) with no place to go may then accumulate in the body region, altering the potential of the body region (referred to below as the body potential). Such alteration of the body potential (floating of the body potential) can alter the threshold voltage of the FET or cause parasitic bipolar operation; these effects are what are referred to as floating body effects.

In Japanese Patent Application Publication (JP) 2005-276912, Hara discloses an SOI MOSFET with a multi-RESURF structure in which the semiconductor layer includes source-body connection regions through which carriers generated by impact ionization can escape. In JP 2000-269509, Hirano discloses an SOI MOS transistor having a body potential extraction region that provides a similar escape path for carriers generated by impact ionization.

These source-body connection and body potential extraction regions will both be referred to below as charge collection regions. By suppressing floating body effects and preventing fluctuations in the body potential, they can increase the drain-source breakdown voltage of the device.

The current driving capability of an FET generally increases with the ratio (W/L) of the gate width (W) to the gate length (L). In the device structures disclosed by Hara and Hirano, the charge collection regions lie adjacent the source regions in the gate width direction. The more of this width that is devoted to the charge collection regions in order to increase the drain-source breakdown voltage, the smaller the width of the source regions becomes, decreasing the current driving capability. If the source regions are widened to provide more current driving capability the width of the entire device increases, making an adequate drain-source breakdown voltage incompatible with small device size.

SUMMARY OF THE INVENTION

An object of the present invention is to provide a semiconductor device of small size having an adequate drain-source breakdown voltage and adequate current driving capability.

The invention provides a novel semiconductor device with a silicon-on-insulator substrate. The substrate includes a base layer, a semiconductor layer formed on the base layer, and a buried insulating layer interposed between the semiconductor layer and the base layer for electrical isolation. A gate insulation film is formed on the semiconductor layer. A gate electrode is formed on the gate insulation film. The gate electrode has a width extending in a first direction and a length $L_g$ extending in a second direction crosswise to the first direction.

A plurality of source diffusion regions are formed by diffusion of an impurity of a first conductivity type into the semiconductor layer on a first side of the gate electrode. The source diffusion regions are mutually aligned in the first direction.

A plurality of charge collection regions formed by diffusion of an impurity of a second conductivity type, differing from the first conductivity type, into the semiconductor layer on the first side of the gate electrode. The charge collection regions are mutually aligned in the first direction.

A drain diffusion region is formed by diffusion of an impurity of the first conductivity type into the semiconductor layer on a second side of the gate electrode, opposite to the first side in the second direction. A body region is disposed in the semiconductor layer, surrounded by the buried insulating layer, the plurality of source diffusion regions, the plurality of charge collection regions, and the drain diffusion region. A drift region is formed in the semiconductor layer, interposed between the body region and the drain diffusion region and having a length $L_{drift}$ extending in the second direction.

The source diffusion regions and charge collection regions are disposed in mutual alternation in the first direction. The source diffusion regions have respective widths $W_{eff}$ extending in the first direction, satisfying the condition $$W_{eff}/2 \leq L_g + L_{drift}/2.$$

Satisfaction of this condition enables the current driving capability of the device to be increased and its size to be reduced with only a limited reduction of the source-drain breakdown voltage.

DETAILED DESCRIPTION OF THE INVENTION

Figure 1:
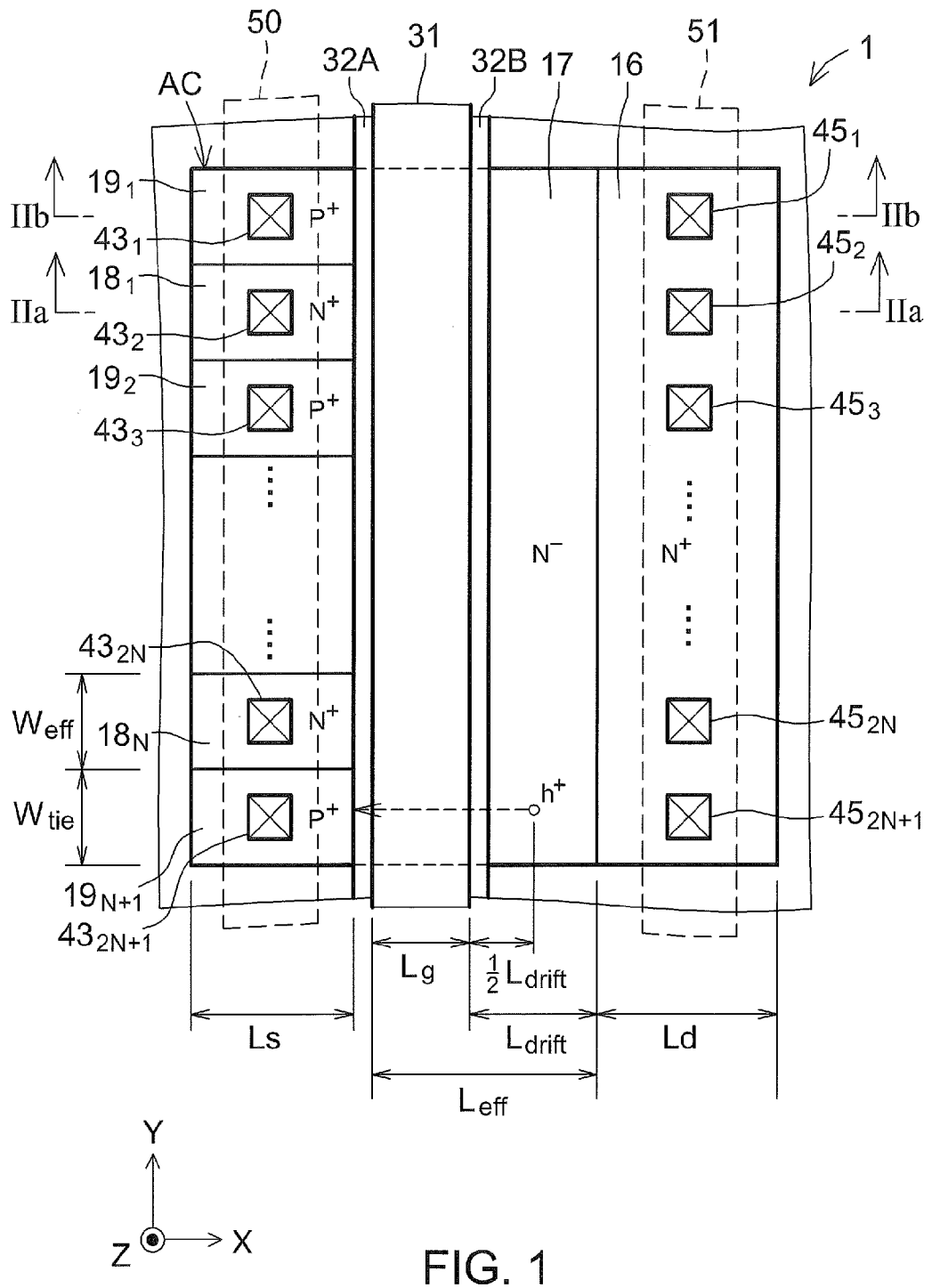
FIG. 1 is a plan view of a semiconductor device embodying the invention.

An embodiment of the invention will now be described with reference to the attached drawings, in which like elements are indicated by like reference characters.

Figure 2A:
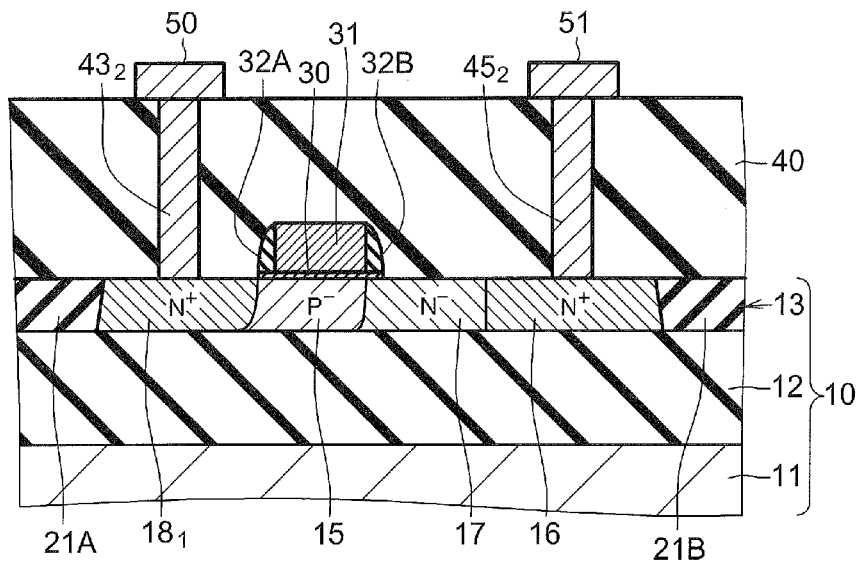
FIG. 2A is a sectional view of the semiconductor device through line IIa-IIa in FIG. 1.
Figure 2B:
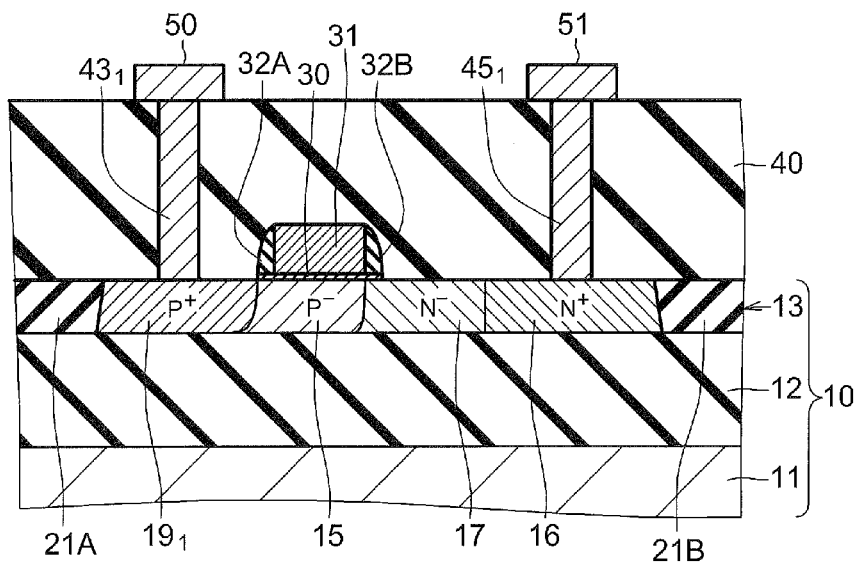
FIG. 2B is a sectional view of the semiconductor device through line IIb-IIb in FIG. 1.

The embodiment is a semiconductor device 1 with the structure partially shown in FIGS. 1, 2A, and 2B. In the Cartesian coordinate system shown in FIG. 1, the Y-axis indicates the first direction and the X-axis indicates the second direction. FIGS. 2A and 2B both illustrate sections parallel to the X-Z plane.

The semiconductor device 1 includes both power and logic circuit sections all formed on the same SOI substrate 10. FIGS. 1, 2A, and 2B show the structure of one power circuit element in the power circuit section. The illustrated circuit element has an N-channel metal-oxide-semiconductor (NMOS) field-effect transistor structure.

As shown in FIGS. 2A and 2B, the SOI substrate 10 includes a base layer 11, a buried insulating layer 12 disposed on the base layer 11, and a semiconductor layer 13 disposed on the buried insulating layer 12. The buried insulating layer 12 electrically isolates the semiconductor layer 13 from the SOI substrate 10. The semiconductor layer 13 includes an active region AC, indicated in FIG. 1, which is defined by a surrounding isolation structure formed in the semiconductor layer 13. The regions 21A and 21B indicated in FIGS. 2A and 2B form part of the isolation structure.

The buried insulating layer 12 is formed as, for example, a silicon oxide layer. The semiconductor layer 13 is, for example, a monocrystalline silicon layer. Alternatively, the semiconductor layer 13 may include both a monocrystalline silicon layer and an underlying buffer layer, such as a silicon-germanium layer, with a greater lattice constant than the monocrystalline silicon layer. The SOI substrate 10 may be manufactured by either the separation-by-implantation-of-oxygen (SIMOX) method or the smart-cut method. No restrictions are placed on the specific structure of the SOI substrate 10 or its method of manufacture.

As shown in FIGS. 1, 2A, and 2B, a gate insulation film 30 is formed on the SOI substrate 10, and a gate electrode 31 of a material such as polycrystalline silicon (polysilicon) is formed on the gate insulation film 30. The width of the gate electrode 31 extends in the Y-direction in FIG. 1. The length $L_g$ of the gate electrode 31 extends in the X-direction. Sidewall spacers 32A, 32B of a dielectric material are formed on the first and second sides of the gate electrode 31. The gate insulation film 30 may be made of silicon oxide ($SiO_2$) or silicon oxynitride (SiON). For example, the gate insulation film 30 may be formed by thermal oxidation of the surface of the semiconductor layer 13 in an atmosphere including a mixture of oxygen gas and an inert gas such as argon or nitrogen.

N source diffusion regions $18_1$-$18_N$ and N+1 charge collection regions or source tie regions $19_1$-$19_{N+1}$ are formed on the first side of the gate electrode 31, which is its left side in FIG. 1, adjacent to the gate electrode 31 in the negative X-direction. The parameter N is an integer greater than one. The source diffusion regions $18_1$-$18_N$ and charge collection regions $19_1$-$19_{N+1}$ are aligned in mutual alternation in the Y-direction. The source diffusion regions $18_1$-$18_N$ are $N^+$-type regions diffused with an impurity such as phosphorus (P) or arsenic (As). The charge collection regions $19_1$-$19_{N+1}$ are $P^+$-type regions diffused with an impurity such as boron (B) or borofluoride ($BF_2$). Having regions $19_1$, $19_{N+1}$ of this $P^+$ diffusion type at both the top and bottom edges of the active region AC in FIG. 1 is an advantage as it prevents the formation of unwanted current paths at these edges.

In the Y-direction, the source diffusion regions $18_1$-$18_N$ have respective widths $W_{eff}$ and the charge collection regions $19_1$-$19_{N+1}$ have respective widths $W_{tie}$. The source diffusion regions $18_1$-$18_N$ and charge collection regions $19_1$-$19_{N+1}$ all have the same length $L_s$ in the X-direction.

A drain diffusion region 16 and a drift region 17 are formed in the active region AC on the second side of the gate electrode 31. The second side is the right side in FIG. 1, adjacent to the gate electrode 31 in the positive X-direction. As shown in FIG. 1, the drain diffusion region 16 and drift region 17 both extend clear across the active region AC, from edge to edge, in the Y-direction, paralleling the gate electrode 31. The drain diffusion region 16 and drift region 17 are both N-type regions doped with an impurity such as phosphorus or arsenic, the drain diffusion region 16 being an $N^+$-type region with a comparatively high impurity concentration, the drift region 17 being an $N^-$-type region with comparatively low impurity concentration. The drain diffusion region 16 has a constant length $L_d$ in the X-direction. The drift region 17 has a constant length $L_{drift}$ in the X-direction.

As shown in FIGS. 2A and 2B, the drift region 17 is interposed between the drain diffusion region 16 and the $P^-$-type body region 15 that underlies the gate electrode 31. The function of the drift region 17 is to control the electric field distribution between the drain diffusion region 16 and the source diffusion regions $18_1$-$18_N$. The doping profile of the drift region 17 is optimized for this purpose as described later. The sum of the length $L_g$ of the gate electrode 31 and the length $L_{drift}$ of the drift region 17 is referred to as the effective gate length $L_{eff}$ of the field-effect transistor ($L_{eff}=L_g+L_{drift}$). The effective gate width of the field-effect transistor is $N \times W_{eff}$.

As shown in FIG. 1, contact plugs $43_1$-$43_{2N+1}$, mutually aligned in the Y-direction, are formed above the source diffusion regions $18_1$-$18_N$ and charge collection regions $19_1$-$19_{N+1}$. Similar contact plugs $45_1$-$45_{2N+1}$, mutually aligned in the Y-direction, are formed above the drain diffusion region 16. As shown in FIGS. 2A and 2B, the lower ends of even-numbered contact plugs $43_2$, $43_4$, ..., $43_{2N}$ make electrical contact with the surfaces of the source diffusion regions $18_1$-$18_N$, the lower ends of odd-numbered contact plugs $43_1$, $43_3$, ..., $43_{2N+1}$ make electrical contact with the surfaces of the charge collection regions $19_1$-$19_{N+1}$, and the lower ends of contact plugs $45_1$, $45_2$, ..., $45_{2N+1}$ make electrical contact with the surface of the drain diffusion region 16.

As shown in FIGS. 2A and 2B, an interlayer dielectric film 40 is formed covering the SOI substrate 10, the gate electrode 31, and its sidewall spacers 32A, 32B. The contact plugs $43_1$-$43_{2N+1}$, $45_1$-$45_{2N+1}$ are embedded in contact holes in the interlayer dielectric film 40. Interconnection wires 50, 51 of a material such as aluminum or copper are formed on the interlayer dielectric film 40. Interconnection wires 50 make electrical contact with the contact plugs $43_1$-$43_{2N+1}$ on the source side while interconnection wires 51 make electrical contact with the contact plugs $45_1$-$45_{2N+1}$ on the drain side.

In this embodiment, the interconnection wires 50 on the source side are connected to a ground terminal (not shown) nominally held at a ground potential (GND), and the interconnection wires 50 on the source side are connected to a power supply terminal (not shown) nominally held at a power supply potential (VDD). The body region 15 is electrically connected to the ground terminal through the charge collection regions $19_1$-$19_{N+1}$ and interconnection wires 50, and is thereby held at a substantially constant body potential equal to the ground potential. When a control voltage is applied to the gate electrode 31 to turn the semiconductor device 1 on, an N-type channel forms between the source diffusion regions $18_1$-$18_N$ and the drift region 17. As current flows through the channel, impact ionization occurs, generating electron-hole pairs. The electrons are drawn to the drain diffusion region 16 as part of the current flow. The holes $h^+$ are drawn to the charge collection regions $19_1$-$19_{N+1}$ and thereby extracted from the body region 15, suppressing the floating gate effect and maintaining the constant potential of the body region 15.

If the width $W_{eff}$ of the source diffusion regions $18_1$-$18_N$ is increased and the width $W_{tie}$ of the charge collection regions $19_1$-$19_{N+1}$ is reduced, the ratio of the effective width of the field effect transistor to its effective gate length ($N \times W_{eff}/L_{eff}$) is increased, increasing its current driving capability, but the number of holes $h^+$ that can be collected per unit time is reduced, so the source-drain breakdown voltage is reduced. Conversely, if the width $W_{eff}$ of the source diffusion regions $18_1$-$18_N$ is reduced and the width $W_{tie}$ of the charge collection regions $19_1$-$19_{N+1}$ is increased, the number of holes $h^-$ that can be collected per unit time is increased, increasing the source-drain breakdown voltage, but the current driving capability is reduced. That is, there is a trade-off between source-drain breakdown voltage and current driving capability.

In this embodiment, the width $W_{eff}$ of the source diffusion regions $18_1$-$18_N$, the lengths $L_{drift}$ of the drift region 17, and the gate length $L_g$ are selected to satisfy the following condition (1).

$$W_{eff}/2 \leq L_g + L_{drift}/2 = L_b \tag{1}$$

The quantity $L_b$ in this equation (1) is the distance from the left edge of the gate electrode 31 to the center of the drift region 17. In this embodiment, impact ionization occurs principally by collision of carriers accelerated by the electric field with atoms in the crystal lattice of the drift region 17, so electron-hole pairs tend to be produced where the field intensity is high: that is, in the area in which the equipotential lines are densely spaced.

The electric field intensity distribution in the drift region 17 is a function of the position (x) in the X-axis direction and the impurity concentration (y) in the drift region 17, and will be denoted E(x, y). The closer the impurity concentration of the drift region 17 is to the impurity concentration of the drain diffusion region 16, the more the position of the maximum peak in the electric field intensity distribution E(x, y) shifts toward the body region 15. Conversely, the lower the impurity concentration of the drift region 17 is, the more the position of peak electric field intensity shifts toward the drain diffusion region 16. If the impurity concentration of the drift region 17 were to be equal to the impurity concentration of the drain diffusion region 16, the drift region 17 would have essentially no moderating effect, and the peak electric field intensity would occur at the junction between the body region 15 and drift region 17. Conversely, if the impurity concentration of the drift region 17 were to be zero, the peak electric field intensity would occur at the junction between the drain diffusion region 16 and drift region 17. As the impurity concentration y is increased from zero to the impurity concentration of the drain diffusion region 16, accordingly, the position of peak electric field intensity gradually moves from the vicinity of the junction between the drain diffusion region 16 and drift region 17 to the vicinity of the junction between the body region 15 and drift region 17. In addition, as the impurity concentration y is increased from zero to the impurity concentration of the drain diffusion region 16, the maximum peak value of the electric field intensity distribution E(x, y) gradually decreases from its initial value to a minimum value, then increases again. If the impurity concentration of the drift region 17 is optimized so that the peak electric field intensity occurs at substantially the center of the drift region or drift region 17, then compared with cases in which the peak electric field intensity occurs elsewhere, the maximum peak value of the electric field intensity distribution E(x, y) is lower and the source-drain breakdown voltage is higher.

As noted above, if the width $W_{eff}$ of the source diffusion regions $18_1$-$18_N$ is increased and the width $W_{tie}$ of the charge collection regions $19_1$-$19_{N+1}$ is reduced, the current driving capability is increased but the source-drain breakdown voltage is reduced. If the width $W_{eff}$ of the source diffusion regions $18_1$-$18_N$ stays within the limit set by the above condition (1), however, an adequate current driving capability is obtained at the cost of only a limited reduction in the source-drain breakdown voltage.

To obtain a satisfactory current driving capability, the width $W_{eff}$ of the source diffusion regions $18_1$-$18_N$ is preferably equal to or greater than the width $W_{tie}$ of the charge collection regions $19_1$-$19_{N+1}$; that is the following condition (2) is satisfied.

$$W_{tie} \leq W_{eff} \tag{2}$$

To reduce the horizontal dimensions of the device, the length $L_b$ is preferably equal to or less than the effective gate width $N \times W_{eff}$; that is the following condition (3) is satisfied.

$$L_b = L_g + L_{drift}/2 \leq N \times W_{eff} \tag{3}$$

A good balance between current driving capability and source-drain breakdown voltage can be obtained by selecting widths $W_{eff}$ and $W_{tie}$ for the source diffusion regions $18_1$-$18_N$ of the charge collection regions $19_1$-$19_{N+1}$ that satisfy conditions (1) and (2) within the additional constraint imposed by condition (3).

Figure 3:
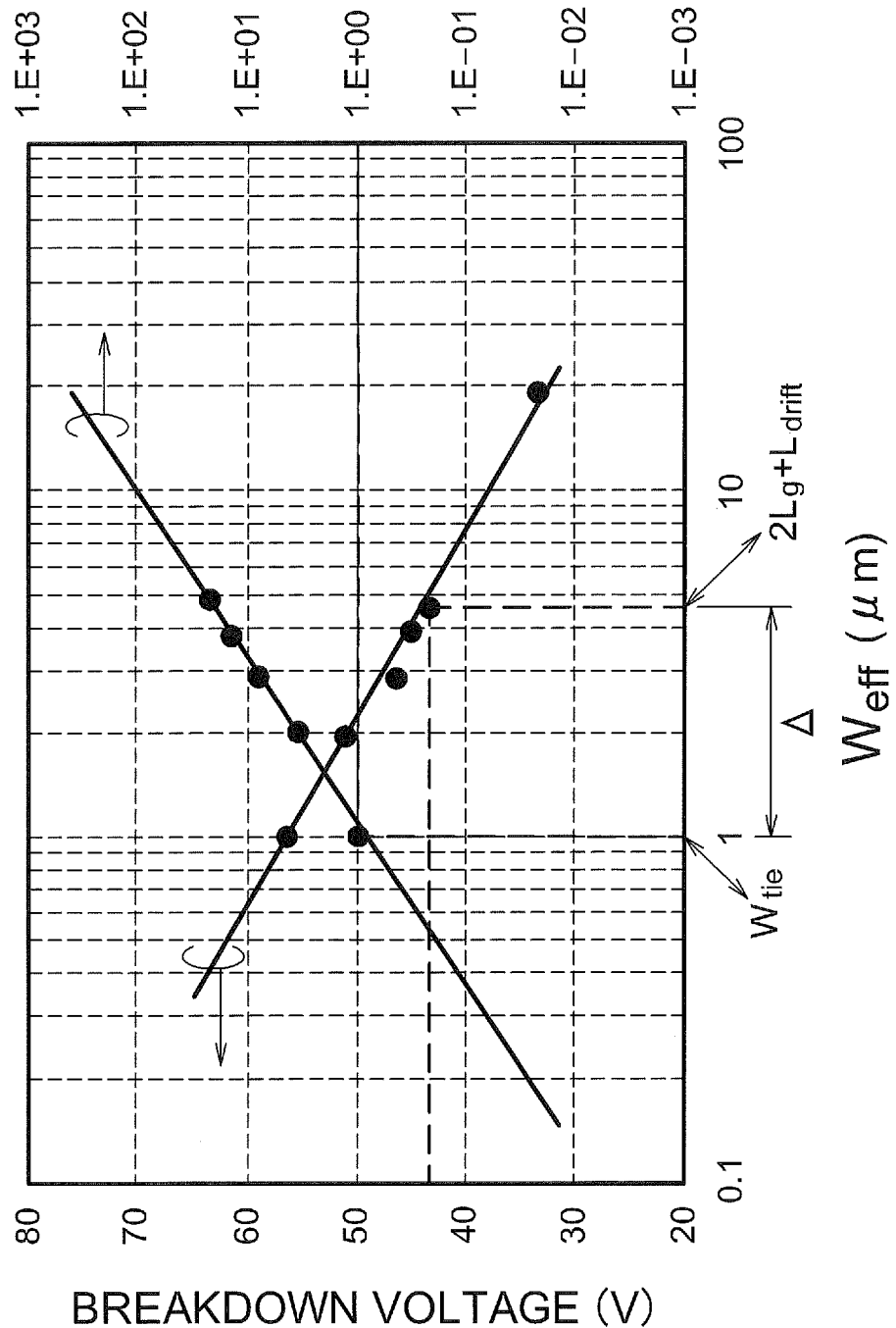
FIG. 3 is a graph showing the source-drain breakdown voltage and current driving capability of the semiconductor device as functions of the width $W_{eff}$ of the source diffusion regions.

The graph in FIG. 3 shows the results of measurements of the source-drain breakdown voltage and relative current driving capability as a function of the width $W_{eff}$ of the source diffusion regions $18_1$-$18_N$. The width $W_{eff}$ of the source diffusion regions $18_1$-$18_N$ is shown in micrometers (µm) on a logarithmic scale on the horizontal axis. The source-drain breakdown voltage is shown in volts (V) on a linear scale on the left vertical axis. The relative current driving capability is shown in arbitrary units on an exponential scale from $1.0 \times 10^{-3}$ (1E-3) to $1.0 \times 10^{+3}$ (1E+3) on the right vertical axis, in which 1.0 represents the drain current when $W_{eff}$ and $W_{tie}$ are equal. The device parameters in the measurement were N=20, $L_s$=1.2 µm, $L_d$ 1.4 µm, $W_{tie}$=1.0 µm, $L_g$=1.4 µm, and $L_{drift}$=1.6 µm. The impurity concentration was $1.0 \times 10^{20}$ atoms/cm³ in the drain diffusion region 16, $1.0 \times 10^{18}$ atoms/cm³ to $1.0 \times 10^{19}$ atoms/cm³ in the drift region 17, $1.0 \times 10^{20}$ atoms/cm³ in the source diffusion regions $18_1$-$18_N$, and $1.0 \times 10^{20}$ atoms/cm³ in the charge collection regions $19_1$-$19_{N+1}$.

Source-drain breakdown voltage was measured with voltages of zero volts (0 V) applied to the source diffusion regions $18_1$-$18_N$ and charge collection regions $19_1$-$19_{N+1}$ through interconnection wiring 50, five volts (5 V) applied to the gate electrode 31, and a gradually increasing voltage applied to the drain diffusion region 16 through interconnection wiring 51. The drain voltage at which the drain current became 0.1 microampere (0.1 µA) was measured as the breakdown value.

As shown in FIG. 3, a good balance between source-drain breakdown voltage and current driving capability was obtained in the range Δ in which the width $W_{eff}$ satisfied conditions (1) and (2).

A method of fabricating the semiconductor device 1 will now be described with reference to the schematic sectional views in FIGS. 4-11, 12A, 12B, 13A, and 13B.

Figure 4:
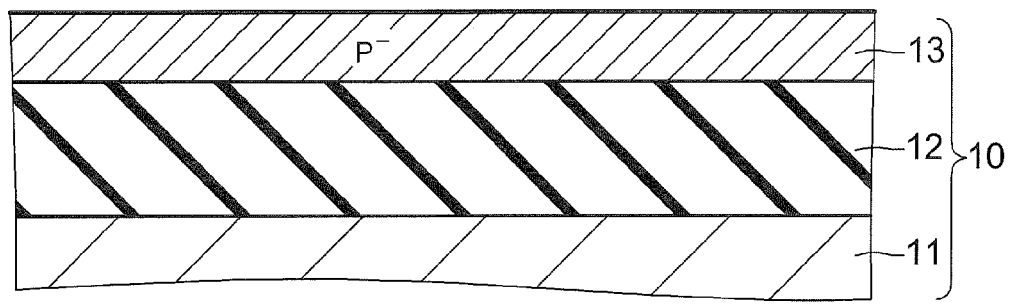
FIGS. 4 to 11 are sectional views illustrating successive steps in the fabrication of the semiconductor device.
Figure 5:
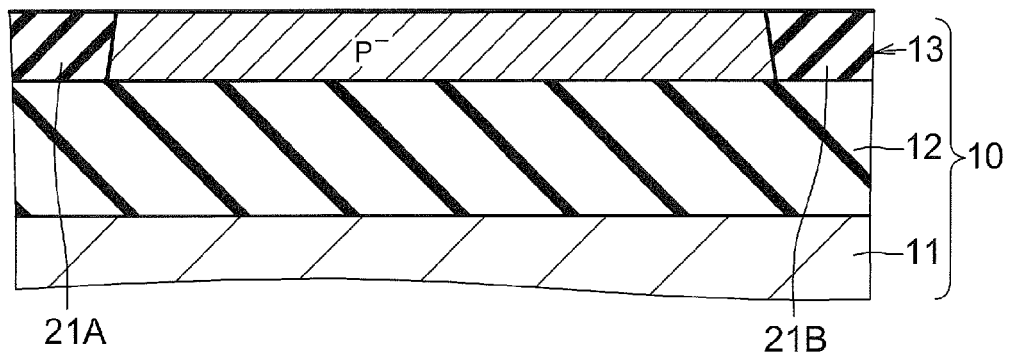

First an SOI substrate 10 is prepared as shown in FIG. 4 by forming a P⁻ diffusion region in the semiconductor layer 13 that constitutes the top layer of the SOI substrate 10. Next, element isolation structures 21A, 21B are formed by a trench isolation technique such as the well known shallow trench isolation (STI) method. To form the element isolation structures 21A, 21B by the STI method, first a thermal oxide layer is formed on the upper surface layer of the SOI substrate 10 in FIG. 4, and a silicon nitride layer is formed on the thermal oxide layer. Next, the silicon nitride layer is selectively etched by well known photolithography and dry etching techniques; then the remaining part of the silicon nitride layer is used as an etching mask to etch the thermal oxide layer and the semiconductor layer 13, thereby forming trenches in the semiconductor layer 13. The inner walls of the trenches are then thermally oxidized, after which a layer of dielectric material is deposited in the trenches. The upper surface of this layer of dielectric material is then planarized by chemical mechanical polishing (CMP). Finally the residual dielectric layers remaining outside the trenches are removed by wet etching, leaving the dielectric material embedded in the trenches as the element isolation structures 21A, 21B in FIG. 5.

Figure 6:
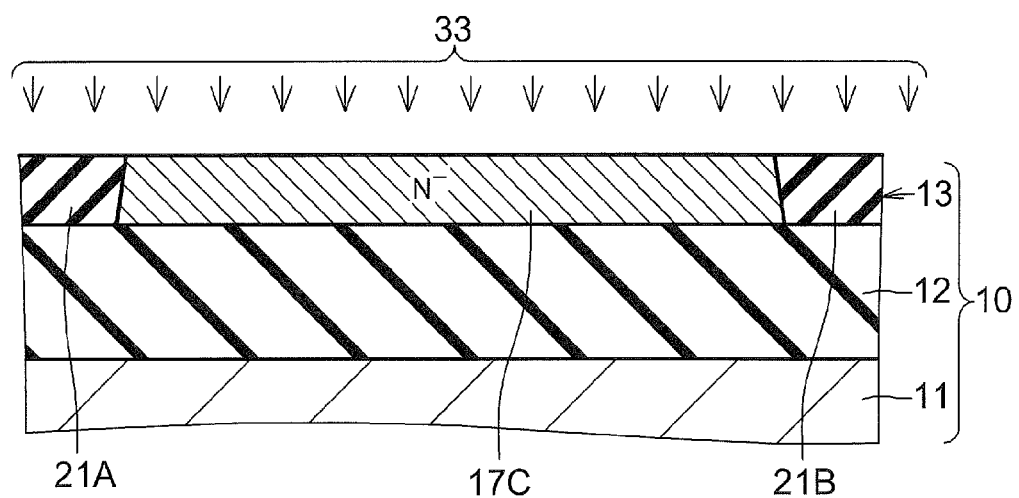

Impurity ions 33 such as phosphorus or arsenic ions are then implanted into the semiconductor layer 13 on the entire surface of the SOI substrate 10 as shown in FIG. 6, creating an N⁻-type impurity diffusion region 17C within the semiconductor layer 13. The implantation dose may be about $1\times10^{12}$ ions/cm² to $1\times10^{13}$ ions/cm². During this fabrication step a resist pattern (not shown) is formed as an ion implantation mask on logic regions, that is, on the parts of the substrate where logic circuits will be formed. This resist pattern is removed after the implantation of the impurity ions 33.

Figure 7:
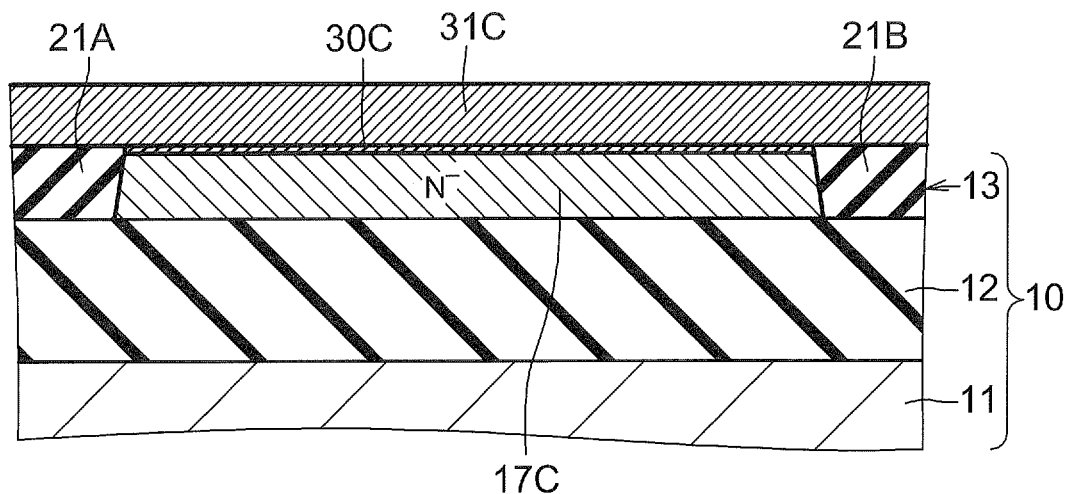

Next, the surface of the semiconductor layer 13 is thermally oxidized to form a thermal oxide film 30C as shown in FIG. 7, which will become the gate insulation film 30, and to activate the N⁻-type impurity diffusion region 17C. This step also forms a thermal oxide film to serve as a gate insulation film in the logic regions (not shown). The thickness of this thermal oxide film 30C may be from one to several nanometers (nm). A layer of electrode material 31C such as polysilicon is then grown by, for example, low-pressure chemical vapor deposition (CVD). The thickness of this layer 31C is controlled to a value on the order of several hundred nanometers. A resist pattern (not shown) is then formed on the electrode layer 31C in FIG. 7, and an anisotropic etch is carried out with this resist pattern as a mask to form the gate electrode 31 shown in FIG. 8. Gate electrodes (not shown) are formed simultaneously in the logic region.

Figure 8:
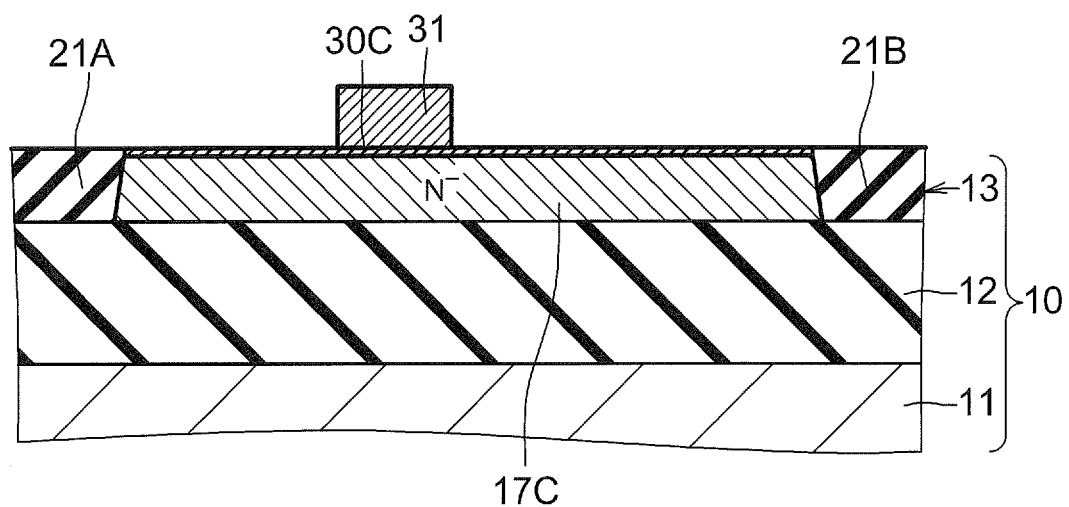
Figure 9:
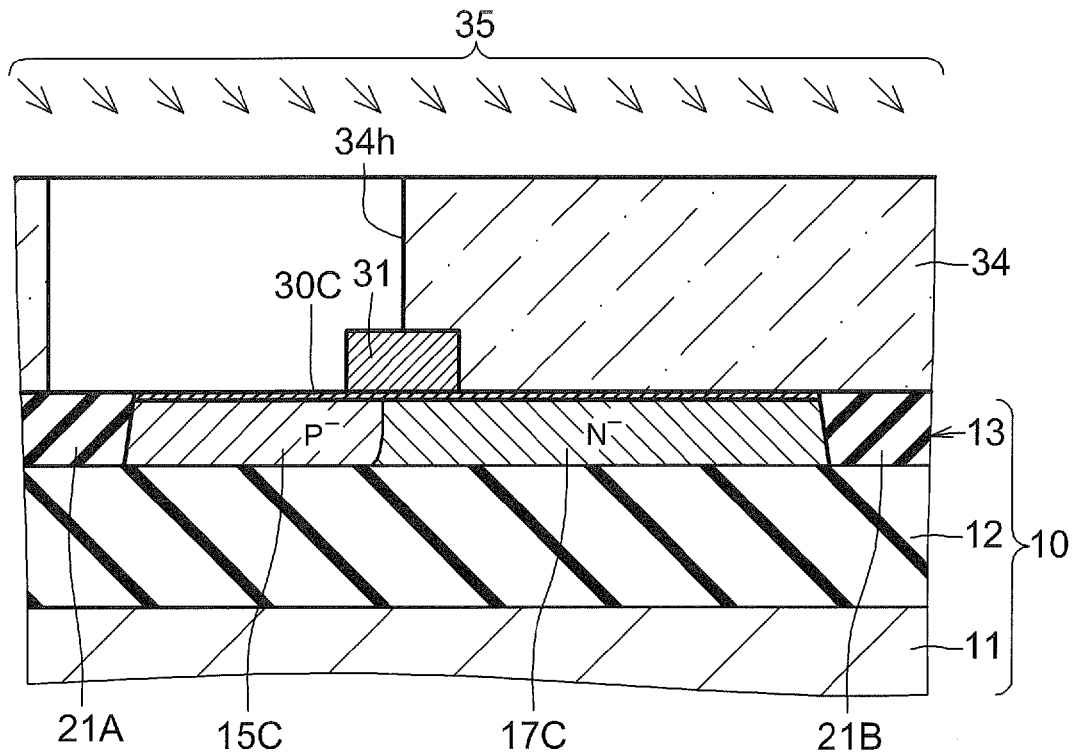

A resist film (not shown) is then formed on the structure in FIG. 8 and patterned to create a resist pattern 34 with an opening 34h as shown in FIG. 9. This resist pattern 34 covers the area in which the drift region 17 will be formed and covers the adjacent part of the gate electrode 31. Impurity ions 35 such as boron (B) ions or borofluoride (BF₂) ions are implanted into the semiconductor layer 13, the resist pattern 34 functioning as a mask, to form a P⁻-type impurity diffusion region 15C, part of which extends below the gate electrode 31. The device is then annealed, activating the impurities in the P⁻-type impurity diffusion region 15C and causing them to diffuse laterally as shown in FIG. 10.

Figure 10:
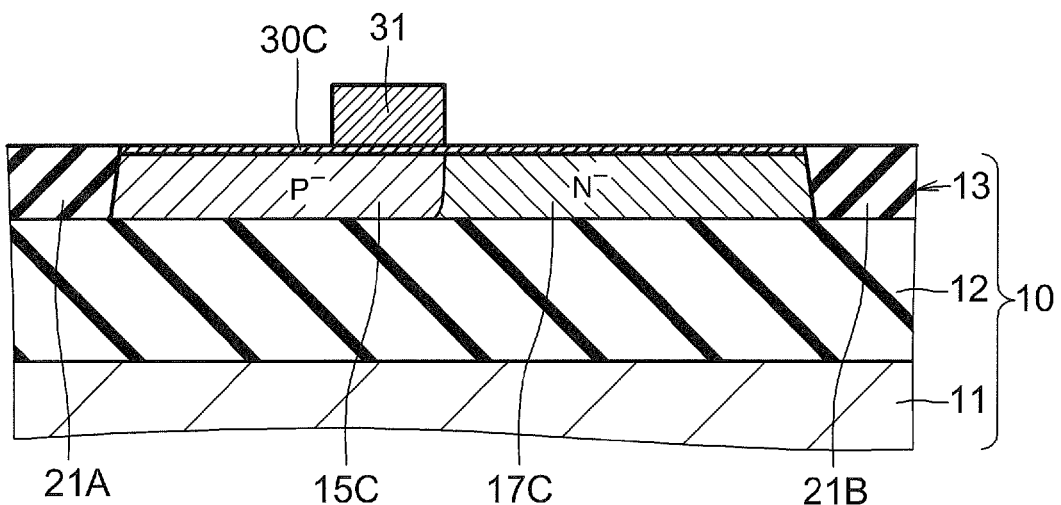
Figure 11:
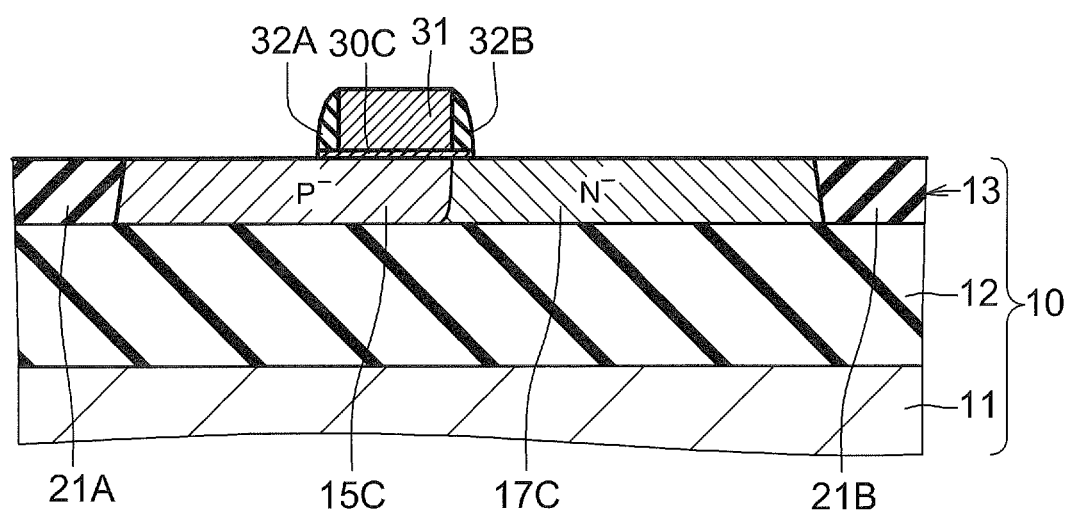

Next, a layer of a dielectric material such as silicon oxide is deposited on the structure shown in FIG. 10 by, for example, CVD, and this layer is anisotropically etched to form the sidewalls 32A, 32B on both sides of the gate electrode 31, as shown in FIG. 11. Similar sidewalls are formed on the gate electrodes (not shown) in the logic area in this step.

Figure 12A:
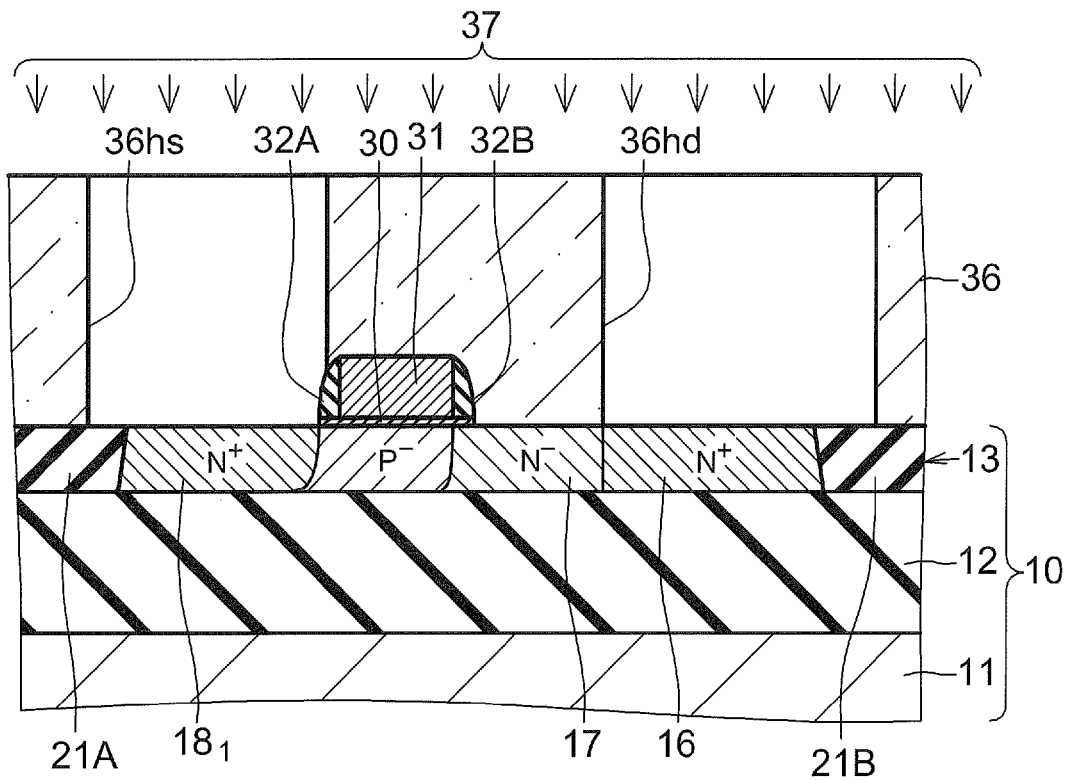
FIGS. 12A and 12B are sectional views illustrating a further step in the fabrication of the semiconductor device.
Figure 12B:
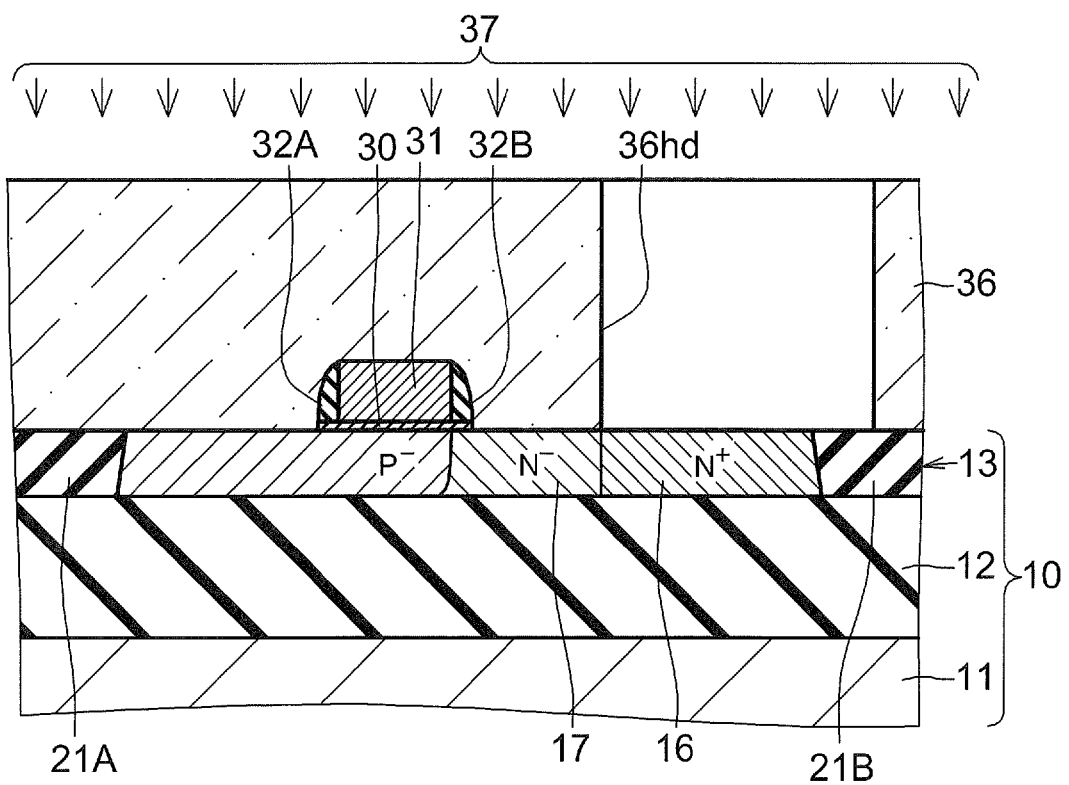

A new resist pattern 36 is now formed by photolithography as shown in FIGS. 12A and 12B. This resist pattern 36 has openings 36hd in the areas in which the drain diffusion region 16 will be formed and openings 36hs in the areas in which the source diffusion regions $18_1$-$18_N$ will be formed, and covers other areas. FIG. 12A shows a section through line IIa-IIa in FIG. 1; FIG. 12B shows a section through line IIb-IIb in FIG. 1. Impurity ions 37 such as phosphorus or arsenic ions are implanted into the semiconductor layer 13, with this resist mask 36 functioning as a mask, to form the drain diffusion region 16 and source diffusion regions $18_1$-$18_N$. The implantation dose may be about $1\times10^{15}$ ions/cm². Source and drain diffusion regions are simultaneously formed for N-channel field effect transistors in the logic region (not shown).

Figure 13A:
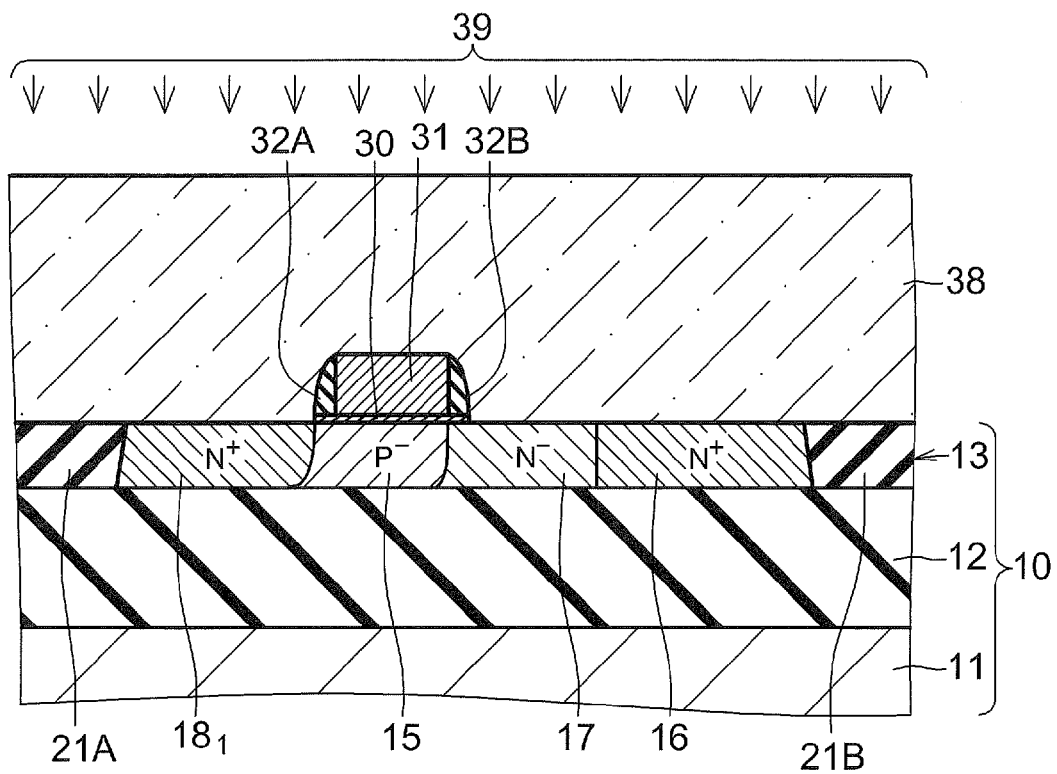
FIGS. 13A and 13B are sectional views illustrating a further still step in the fabrication of the semiconductor device.
Figure 13B:
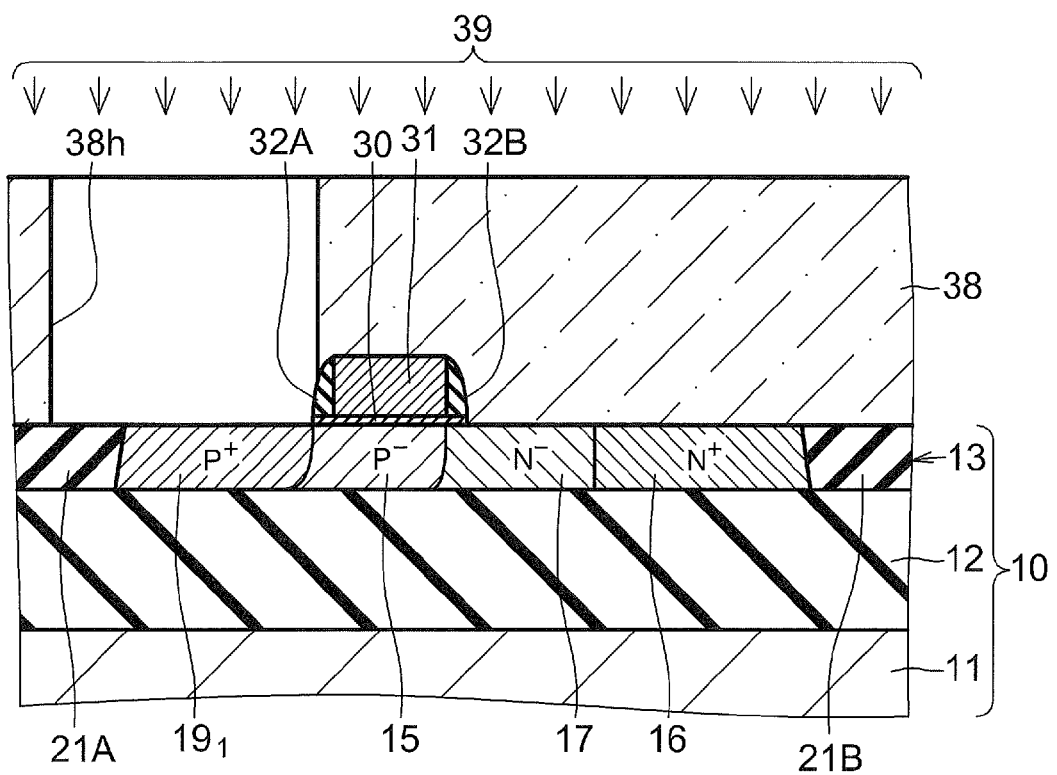

Resist pattern 36 is then replaced with a resist pattern 38 formed by photolithography as shown in FIGS. 13A and 13B. This resist pattern 38 has openings 38h in the areas in which the charge collection regions $19_1$-$19_{N+1}$ will be formed, and covers other areas. FIG. 13A shows the same section as in FIG. 12A, and FIG. 13B shown the same section as in FIG. 12B. Impurity ions 39 such as boron or borofluoride ions are implanted into the semiconductor layer 13, with this resist mask 38 functioning as a mask, to form the source diffusion regions $18_1$-$18_N$. The implantation dose may be about $1\times10^{15}$ ions/cm².

Next, a dielectric material is deposited to a thickness of one to several micrometers by CVD to form the interlayer dielectric film 40. Contact holes are formed in the interlayer dielectric film 40 by photolithography and anisotropic etching. A layer of a conductive barrier material such titanium (Ti) or titanium nitride (TiN) is formed in the contact holes by sputtering, and the contact holes are then filled in with a conductive material such as tungsten to form the contact plugs $43_1$-$43_{2N+1}$ and $45_1$-$45_{2N+1}$ shown in FIGS. 1, 2A, and 2B. Finally, interconnection wiring 50, 51 is formed on the interlayer dielectric film 40, making electrical contact with the contact plugs $43_1$-$43_{2N+1}$ and $45_1$-$45_{2N+1}$, to complete the semiconductor device 1 in this embodiment.

As described above, the source diffusion regions $18_1$-$18_N$ alternate with the charge collection regions $19_1$-$19_{N+1}$ in the gate width direction (Y-direction), which reduces the distance from the site in the drift region 17 where impact ionization occurs to the charge collection regions $19_1$-$19_{N+1}$. Most of the carriers (holes) h⁺ generated by impact ionization travel in the negative X-direction and quickly reach one of the charge collection regions $19_1$-$19_{N+1}$, where they are removed. The effective length $L_{eff}$ can therefore be reduced to reduce the size of the device with only a limited reduction in the source-drain breakdown voltage.

When the widths $W_{eff}$ of the source diffusion regions $18_1$-$18_N$ are limited by condition (1), if the impurity concentration in the drift region 17 is optimized, an adequate current driving capability can be obtained with only a limited reduction in the source-drain breakdown voltage.

Figure 14:
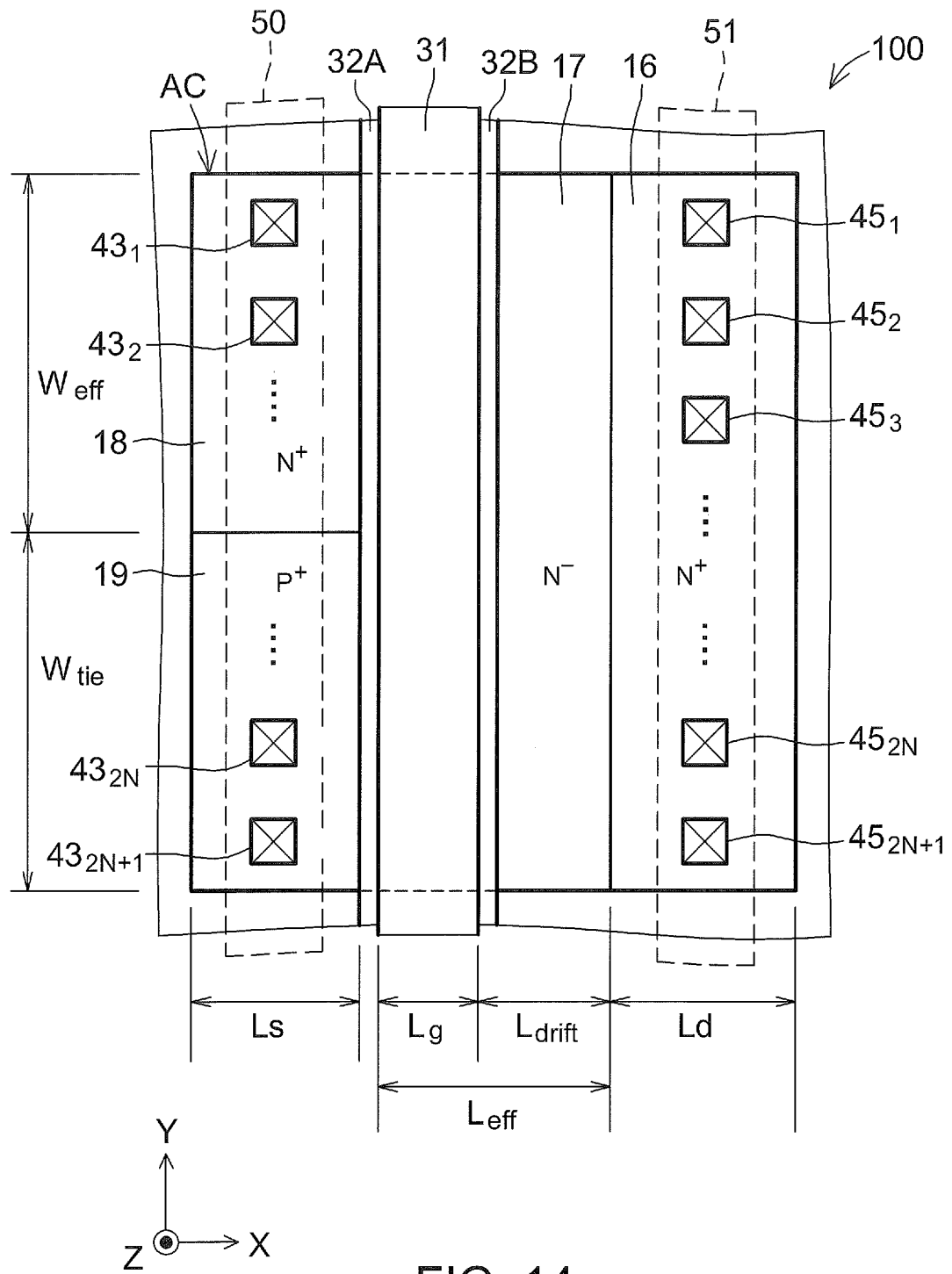
FIG. 14 is a plan view of a semiconductor device not embodying the invention.

For comparison, FIG. 14 shows a semiconductor device 100 having a single source diffusion region 18 and a single charge collection region 19. The source diffusion region 18 occupies the upper part of the width of the active region AC in the drawing, and the charge collection region 19 occupies the lower part of this width. In other respects, this semiconductor device 100 is substantially identical to the semiconductor device 1 in the present embodiment.

Figure 15:
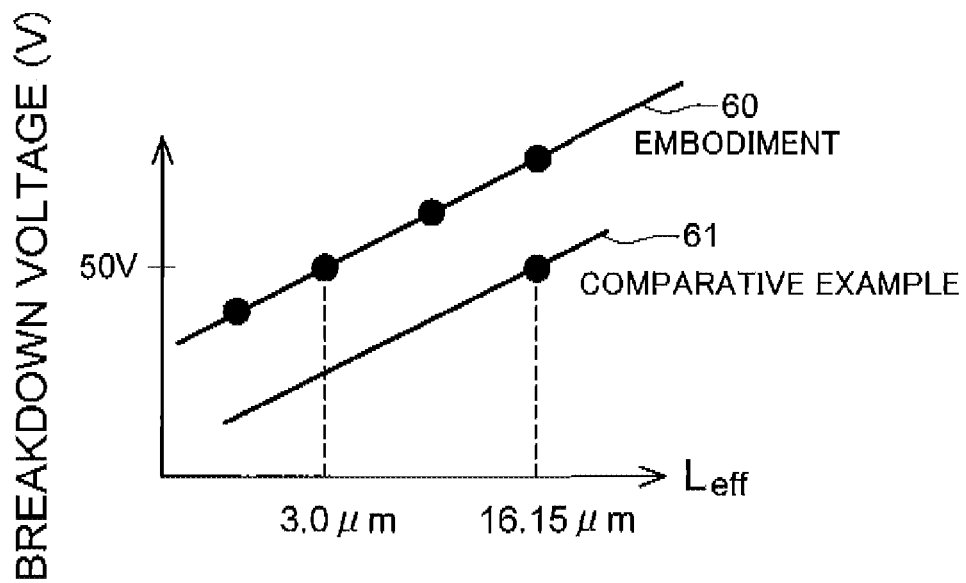
FIG. 15 is a graph showing the source-drain breakdown voltage of the semiconductor device as a function of the effective gate length.

The results of measurements of the source-drain breakdown voltage in the semiconductor device 1 in the present embodiment and in this comparative semiconductor device 100 are plotted in FIG. 15 as functions of the effective gate length $L_{eff}$. The device parameters were the same as for the measurements in FIG. 3 except that the effective gate length $L_{eff}$ was varied by varying the length $L_{drift}$ of the drift region 17. The gate length $L_g$ was left constant at 1.4 µm. Line 60 in FIG. 15 indicates the measurement results for the semiconductor device 1 in the present embodiment. Line 61 is a parallel line drawn through the single measurement result for the comparative semiconductor device 100. As FIG. 15 indicates, to obtain a source-drain breakdown voltage of at least 50 V it is necessary to have an effective gate length $L_{eff}$ of 16.15 µm in the comparative semiconductor device 100, while an effective gate length of only 3.0 µm suffices in the semiconductor device 1 in the present embodiment. In comparison with semiconductor device 100, accordingly, the semiconductor device 1 in the present embodiment can provide superior voltage withstanding performance in a smaller device size.

Figure 16:
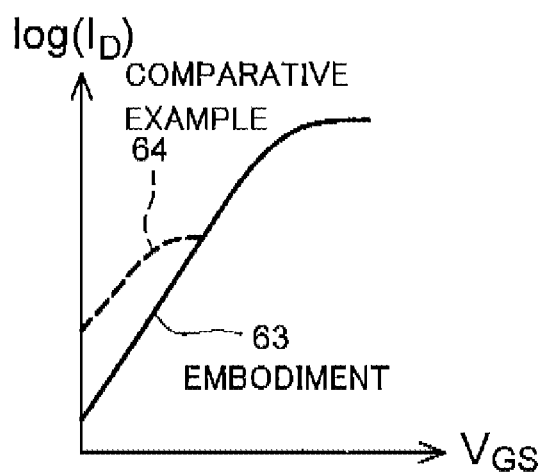
FIG. 16 is a graph illustrating the relation between drain current and gate-source voltage.

Furthermore, because of the array of charge collection regions $19_1$-$19_{N+1}$ extending in the gate width direction (the Y-direction) across the active region AC in FIG. 1, parasitic channel leakage is reduced as compared with a device in which a charge collection region is formed at only one edge of the active region. This feature can prevent the appearance of a hump in the rising portion of the drain current versus gate-source voltage characteristic of the device. Line 63 in FIG. 16 schematically illustrates this characteristic for the novel semiconductor device 1. Dashed line 64 illustrates the hump that occurs if the charge collection region is confined to one side, in the gate width direction, of the active region AC. The reason for the hump is the formation of an unwanted current path at the edge of the active region AC where the source diffusion 18 is formed.

The invention is not limited to the preceding embodiment. For example, if impurities of reverse conductivity types are used, a P-channel (PMOS) field-effect transistor can be formed in the SOI substrate 10 instead of the NMOS field-effect transistor shown in the drawings.

The invention can also be applied to transistors with structures other than the metal-oxide-semiconductor (MOS) structure. For example, the device may include a metal-insulator-semiconductor (MIS) field-effect transistor using a high-dielectric film other than an oxide film as the gate insulation film 30.

Those skilled in the art will recognize that further variations are possible within the scope of the invention, which is defined in the appended claims.

What is claimed is:

1. A semiconductor device with a silicon-on-insulator substrate, the silicon-on-insulator substrate including a base layer, a semiconductor layer formed on the base layer, and a buried insulating layer interposed between the semiconductor layer and the base layer to electrically isolate the semiconductor layer from the base layer, the semiconductor device comprising:
    a gate insulation film formed on the semiconductor layer;
    a gate electrode formed on the gate insulation film, having a width extending in a first direction and a length $L_g$ extending in a second direction that is crosswise to the first direction;
    a plurality of source diffusion regions formed by diffusion of an impurity of a first conductivity type into the semiconductor layer on a first side of the gate electrode, the plurality of source diffusion regions being mutually aligned in the first direction;
    a plurality of charge collection regions formed by diffusion of an impurity of a second conductivity type differing from the first conductivity type into the semiconductor layer on the first side of the gate electrode, the plurality of charge collection regions being mutually aligned in the first direction;
    a drain diffusion region formed by diffusion of an impurity of the first conductivity type into the semiconductor layer on a second side of the gate electrode opposite from the first side in the second direction;
    a body region disposed in the semiconductor layer, the body region being surrounded by the buried insulating layer, the plurality of source diffusion regions, the plurality of charge collection regions, and the drain diffusion region; and
    a drift region formed in the semiconductor layer, the drift region being interposed between the body region and the drain diffusion region and having a length $L_{drift}$ extending in the second direction; wherein:
    the plurality of source diffusion regions and the plurality of charge collection regions are disposed in mutual alternation in the first direction;
    the plurality of source diffusion regions have respective widths $W_{eff}$ extending in the first direction, the widths $W_{eff}$ being not less than 1.0 µm; and $$W_{eff} \geq 2L_g + L_{drift}/2.$$

2. The semiconductor device of claim 1, wherein the drift region has an impurity concentration profile optimized to create, in the second direction, an electric field intensity distribution with a maximum peak at a center of the drift region.

3. The semiconductor device of claim 2, wherein the drift region is formed by diffusion of an impurity of the first conductivity type and has a lower impurity concentration than the drain diffusion region.

4. The semiconductor device of claim 3, wherein the body region is of the second conductivity type and forms a junction with the drift region, the junction being positioned at an edge of the gate electrode on the second side of the gate electrode.

5. The semiconductor device of claim 1, wherein the plurality of charge collection regions have respective widths $W_{tie}$ extending in the first direction, the widths $W_{tie}$ being not less than 1.0 µm, and $$W_{tie} \leq W_{eff}.$$

6. The semiconductor device of claim 1, wherein the plurality of source diffusion regions is comprised of N source diffusion regions, N being an integer greater than one and being not more than twenty, and $$L_g + L_{drift}/2N \times W_{eff}.$$

7. The semiconductor device of claim 1, wherein the semiconductor layer includes an active region defined by a surrounding isolation structure, the plurality of source diffusion regions and the plurality of charge collection regions are formed in the active region, and two of the plurality of charge collection regions are disposed at mutually opposite edges of the active region in the first direction.

8. The semiconductor device of claim 1, wherein the semiconductor layer includes silicon and the buried insulating layer includes silicon oxide.

9. The semiconductor device of claim 1, further comprising:
- a plurality of first contact plugs making respective electrical contact with the plurality of charge collection regions;
- a plurality of second contact plugs making respective electrical contact with the plurality of source diffusion regions; and
- a third contact plug making electrical contact with the drain diffusion region.

10. The semiconductor device of claim 9, further comprising:
- first interconnection wiring making electrical contact with the first and second contact plugs; and
- second interconnection wiring making electrical contact with the at least one third contact plug.

11. The semiconductor device of claim 10, wherein the first interconnection wiring supplies a first potential to the plurality of source diffusion regions and the plurality of charge collection regions, and the second interconnection wiring supplies a second potential to the drain diffusion region.

\* \* \* \* \*